(12) United States Patent
Ulrich

(10) Patent No.: US 7,160,656 B2
(45) Date of Patent: Jan. 9, 2007

(54) METHOD FOR DETERMINING PATTERN MISALIGNMENT OVER A SUBSTRATE

(75) Inventor: Bruce D. Ulrich, Beaverton, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 11/336,492

(22) Filed: Jan. 20, 2006

(65) Prior Publication Data

US 2006/0121374 A1    Jun. 8, 2006

Related U.S. Application Data

(62) Division of application No. 10/985,219, filed on Nov. 9, 2004, now Pat. No. 7,008,756, which is a division of application No. 09/822,093, filed on Mar. 30, 2001, now Pat. No. 6,864,589.

(51) Int. Cl.
*G03F 9/00* (2006.01)
(52) U.S. Cl. .......................................... 430/22; 430/30
(58) Field of Classification Search ................... 430/5, 430/22, 30
See application file for complete search history.

(56) References Cited

U.S. PATENT DOCUMENTS 5,017,514 A * 5/1991 Nishimoto ................... 438/14

6,465,322 B1 * 10/2002 Ziger et al. .................. 438/401

* cited by examiner

*Primary Examiner*—Christopher G. Young
(74) *Attorney, Agent, or Firm*—Law Office of Gerald Maliszewski; Gerald Maliszewski

(57) ABSTRACT

A two dimensional vernier is provided along with a method of fabrication. The two dimensional vernier has a reference array patterned into a substrate, or a material overlying the substrate. An active array is patterned into photoresist overlying the substrate or the material. Both the reference array and the active array each comprise a two dimensional array of shapes. A difference between a combination of size or spacing of the shapes in each array determines vernier resolution. Vernier range is determined by a combination of vernier resolution and an integer related to a total number of shapes along a given axis. The two dimensional vernier allows an operator to readily measure the misalignment of a pattern to be processed relative to a previous pattern in two dimensions using a microscope. The two dimensional vernier reduces, or eliminates, repositioning of the microscope to determine both x-axis misalignment and y-axis misalignment. If a significant misalignment is detected the photoresist can be stripped and the lithography step repeated prior to subsequent processing, and possible yield reduction.

7 Claims, 7 Drawing Sheets

METHOD FOR DETERMINING PATTERN MISALIGNMENT OVER A SUBSTRATE

RELATED APPLICATIONS

This application is a Divisional of a patent application entitled, X/Y ALIGNMENT VERNIER AND METHOD OF FABRICATING SAME, invented by Bruce Ulrich, Ser. No. 10/985,219, filed Nov. 9, 2004 now U.S. Pat. No. 7,008,756, which is a Divisional of a patent entitled, X/Y ALIGNMENT VERNIER FORMED ON A SUBSTRATE, invented by Bruce Ulrich, application Ser. No. 09/822,093, filed Mar. 30, 2001 now U.S. Pat. No. 6,864,589. Both these applications are incorporated herein by reference.

BACKGROUND OF THE INVENTION

This invention relates generally to manufacturing processes requiring lithography, and more particularly to an X/Y vernier for ascertaining misalignment of a lithographic step relative to an underlying pattern.

Lithography has a broad range of industrial applications, including the manufacture of integrated circuits, flat-panel displays, and micromachines.

The lithographic process transfers a mask, or reticle, pattern onto a substrate. Usually, the pattern is formed in a photoresist layer overlying the substrate. The pattern may then be etched into a material underlying the photoresist layer. For example, in the case of inlaid copper, copper is deposited into trenches formed by the etch step and then polished using CMP to form the desired copper lines. This layer will include a reference pattern. A second device layer to be formed will be patterned using photoresist. The second layer will include an active pattern in addition to the desired device related features. Prior to completion of the process associated with the second device layer, the photoresist pattern is compared to the underlying reference pattern to confirm alignment, or measure misalignment.

Referring now to FIG. 1 (prior art), a typical vernier 10 is shown. The vernier is comprised of two patterns aligned adjacent to each other. The first pattern 12, which is also called the reference pattern, is assimilated into the substrate, or an overlying layer, depositing material, by etching, or otherwise delineating the pattern. The second pattern 14, which is also called the active pattern, is a layer of photoresist that has been patterned. This vernier could be used, for example, to check the alignment during the formation of multiple metal layers. It is necessary to check the alignment of the second pattern 14 relative to the first pattern 12 prior to continuing with the subsequent process steps. If the alignment is beyond a predetermined tolerance, the second pattern 14 can be removed and redone, prior to additional processing. The alignment may be checked by viewing the pattern under a microscope.

A proper alignment would be shown by proper alignment of the first centerline 16, and the second centerline 18. As shown in FIG. 1 (prior art) the patterns are out of alignment as the two most apparently aligned features are reference pattern mark 20 and active pattern mark 22. If this misalignment were outside of an acceptable range, the second pattern would have to be removed, re-exposed, and re-checked. If the wafer is not reworked while out of alignment there a significant likelihood of producing a wafer with poor yield.

A disadvantage of this type of vernier is that only one direction is available for inspection at a time. As shown in FIG. 1 (prior art) only the x-direction can be determined. A second vernier, rotated 90-degrees relative to the one shown, will need to be provided in order to inspect alignment along the y-direction. Although these verniers are usually formed within a scribe sheet, in order to avoid interference with device structures, they may not be easy to find. The x-direction and the y-direction may be a relatively large distance from each other. Even if the x-direction and y-direction are in close proximity, it will require reading two verniers to determine proper alignment in both axes. This wastes time during inspections, and may slow wafer fab processing. In some cases where the vernier is not within a scribe line, it may also waste valuable wafer area that could be used for constructing devices.

SUMMARY OF THE INVENTION

A two-dimensional vernier formed on a substrate is provided. The vernier comprises a first two-dimensional array of spaced shapes and a second two-dimensional array of spaced shapes overlying the first two-dimensional array of spaced shapes. The first two-dimensional array has a first distance across each shape and a first distance between adjacent shapes. The first two-dimensional array has a first pitch defined by the first distance across each shape and the first distance between adjacent shapes. The second two-dimensional array has a second distance across each shape and a second distance between adjacent shapes. The second two-dimensional array has a second pitch defined by the sum of second distance across each shape and the second distance between adjacent shapes. The second pitch is different from the first pitch and this difference determines the resolution of the vernier.

The vernier can be symmetrical in the x-axis and the y-axis having the same number, size and spacing of shapes in both axes. Alternatively, the vernier may be asymmetrical with a different number, size or spacing of shapes in one direction versus another.

In addition to the two arrays of shapes, the vernier may further comprise measurement guides. The measurement guides may include centerline marks, direction marks, both positive and negative, and alignment marks. The measurement guides are preferably formed adjacent to the first array of spaced shapes. Alternatively, the measurement guides are formed adjacent to the second array of spaced shapes.

The first array of spaced shapes may be patterned as either a dark field pattern, in which spaced shapes appears bright, or a light field pattern, in which the spaced shapes appear dark. Likewise the second array of spaced shapes can be either dark field or light field regardless of whether the underlying first array of spaced shapes is dark field or light field.

A method of forming the vernier described above comprises the steps of forming a reference pattern on the substrate. This step of forming the reference pattern on the substrate may be accomplished by etching the substrate, or by depositing a material over the substrate and etching the material. The reference pattern preferably includes the first array of spaced shapes and the measurement guides. Following the step of forming the reference pattern, a step of depositing a layer of photoresist over the reference completed. Then, the photoresist is patterned to produce an active pattern, which comprises the second array of spaced shapes.

The two-dimensional vernier may be used to readily determine misalignment of two patterns formed over a substrate in two dimensions simultaneously, that is without looking at two different verniers. A method of determining misalignment between two patterns formed over a substrate comprising the steps of: positioning a two dimensional vernier under a microscope, determining an alignment region, identifying a pair of overlapped shapes that are most fully aligned, and ascertaining the position of the pair of overlapped shapes.

DETAILED DESCRIPTION OF THE INVENTION

Figure 1:
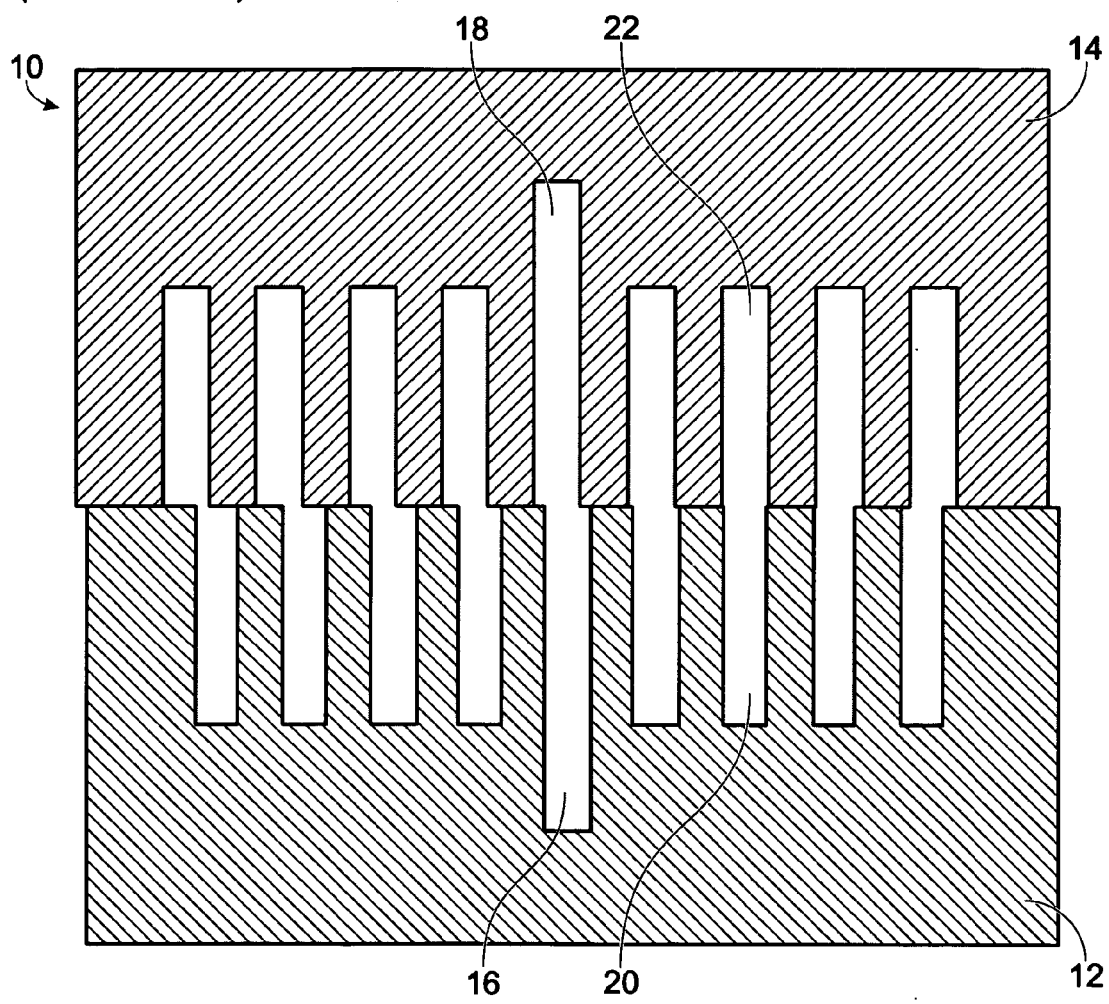
FIG. 1 (prior art) is a plan view of a one dimensional vernier.
Figure 2:
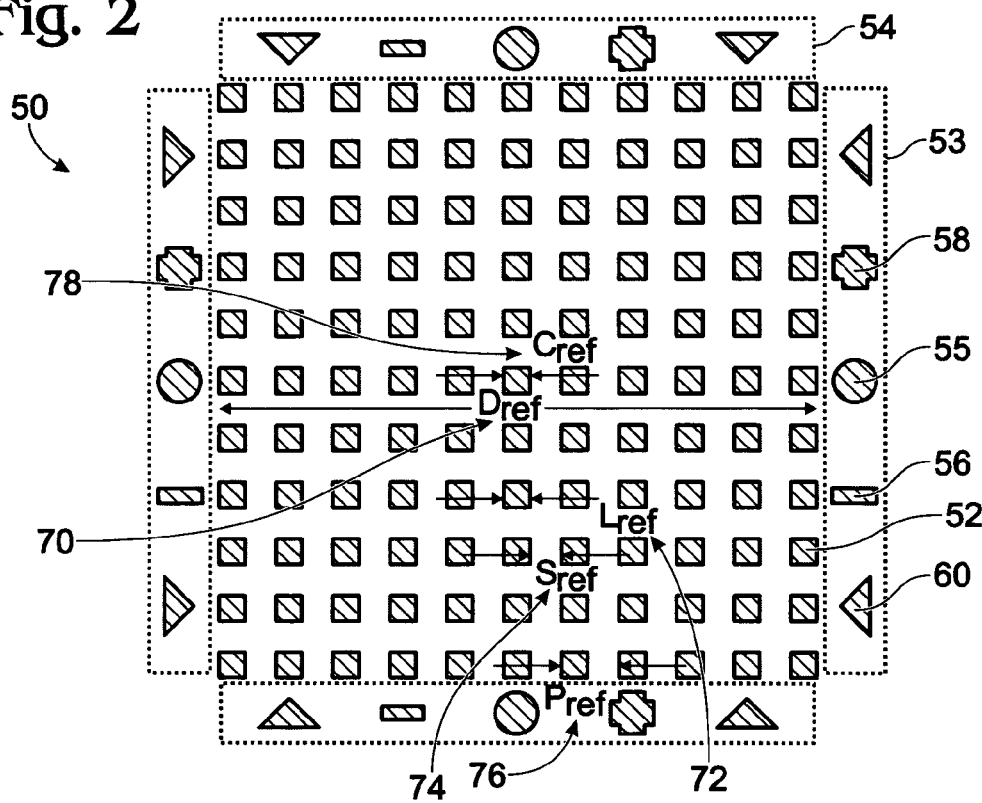
FIG. 2 is a plan view of a reference layer with a light field.
Figure 3:
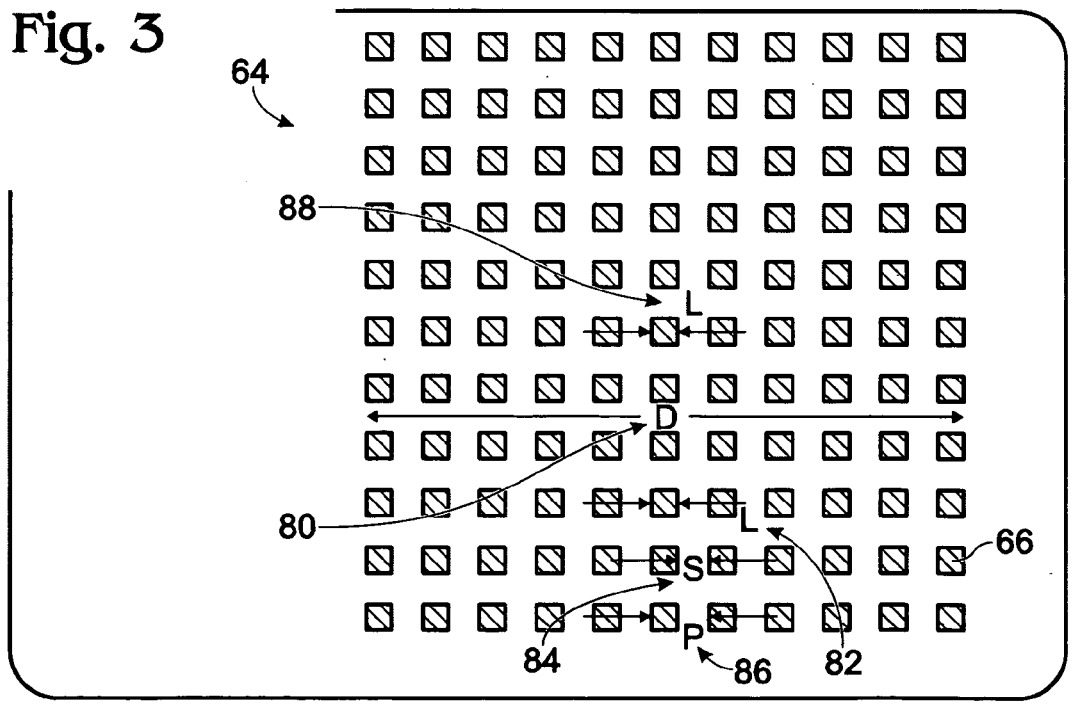
FIG. 3 is a plan view of an active layer light field.

Referring to FIG. 2 and FIG. 3, a two dimensional vernier, also referred to as an x/y vernier, is provided. A first part of the vernier, a reference pattern 50, is shown in FIG. 2. The reference pattern 50 comprises a first array of shapes 52. In addition, x-axis measurement guides 53 (indicated by a dotted line) and y-axis measurement guides 54 (indicated by a dotted line) may be added adjacent the first array of shapes 52. Each set of either x-axis measurement guides 53, or y-axis measurement guides 53 comprise a set of centerline marks 55, a set of negative direction marks 56, a set of positive direction marks 58, and miscellaneous alignment marks 60, which may be used to indicate acceptable ranges of misalignment. The various alignment marks are preferable, but are not necessary to the formation or use of the vernier. The first array of shapes 52 is shown as small squares. They may be any desired shapes but squares or circles are preferable.

FIG. 3 shows a second part of the vernier, an active pattern 64. The active pattern 64 comprises a second array of shapes 66. Just as with the first array of shapes 52, the second array of shapes 66 is shown as small squares. As discussed above, other shapes may be used including circles. The second array of shapes 66 need not be comprised of the same shapes as those used for the first array of shapes. As shown, there are no alignment marks on the active pattern 64. It is possible to incorporate measurement guides into the active pattern 64, either in addition to, or instead of, the x-axis measurement guides 53 and the y-axis measurement guides 54 incorporated into the reference pattern shown in FIG. 2.

The vernier is formed by delineating the reference pattern 50 onto the substrate, or a layer overlying the substrate, and superimposing the active pattern 64 over the reference pattern 50 by patterning the active pattern 64 into an overlying photoresist layer.

The design of the vernier will now be discussed. Referring again to FIG. 2, the total distance across the reference pattern 50 is shown at 70 as $D_{ref}$. Reference linewidth, $L_{ref}$, is shown at 72. Reference spacewidth, $S_{ref}$, is shown at 74. Reference pitch, $P_{ref}$, is shown at 76. The reference pitch is equal to the sum of the reference linewidth and the reference spacewidth ($P_{ref}=L_{ref}+S_{ref}$). The reference center, $C_{ref}$, 78 is shown as corresponding to the reference linewidth, $L_{ref}$. The reference center, $C_{ref}$, 78 may correspond to the reference spacewidth, $S_{ref}$, where the number of shapes on a given axis are even, instead of odd.

The number of shapes, N, that traverse the vernier is an integer value.

$$N=(D_{ref}+C_{ref})/P_{ref}$$

where $C_{ref}$ equals $L_{ref}$ or $S_{ref}$. For example referring to FIG. 2, where N equals 11, $L_{ref}$ equals $S_{ref}$, and $C_{ref}$ equals $L_{ref}$, it is possible to solve for the distance across $D_{ref}$.

$$D_{ref}=21\times L_{ref}$$

So, if the linewidth $L_{ref}$ equals 3 micrometers, the total distance across the vernier, $D_{ref}$, will be 63 micrometers.

Referring again to FIG. 3, the total distance across the actvive pattern 64 is shown at 80 as D. Active linewidth, L, is shown at 82. Active spacewidth, S, is shown at 84. Active pitch, P, is shown at 86. The active pitch is equal to the sum of the active linewidth and the active spacewidth (P=L+S). The active center, C, 88 is shown as corresponding to the active linewidth, L. The active center, C, 88 may correspond to the active spacewidth, S, where the number of shapes on a given axis are even, instead of odd.

The most important aspects of the vernier, are the vernier resolution, Res, and the vernier range, Range. The resolution is defined as the smallest unit of distance of misalignment that can be determined with the vernier and is equal to the difference between the reference pitch and the active pitch.

$$Res=|P-P_{ref}|$$

The range of the vernier is defined as the maximum misalignment that can be determined.

$$Range=Res\times(N-1)$$

The range and the resolution of the vernier can be independently designed. For a given resolution, the range can be increased by increasing N. N may be increased without needing to increase the distances across either vernier, $D_{ref}$ or D. For a given range, the resolution can be adjusted by controlling the relative pitches between the reference pattern and the active pattern.

As shown the reference pattern 50 and the active pattern 64 are symmetrical, having the same $D_{ref}$ or D for both the x-direction and the y-direction. Although a symmetrical pattern is generally preferred, in some applications an asymmetrical pattern may be used for example one direction could be longer than another, have a different resolution, or a different range than the other.

Figure 4:
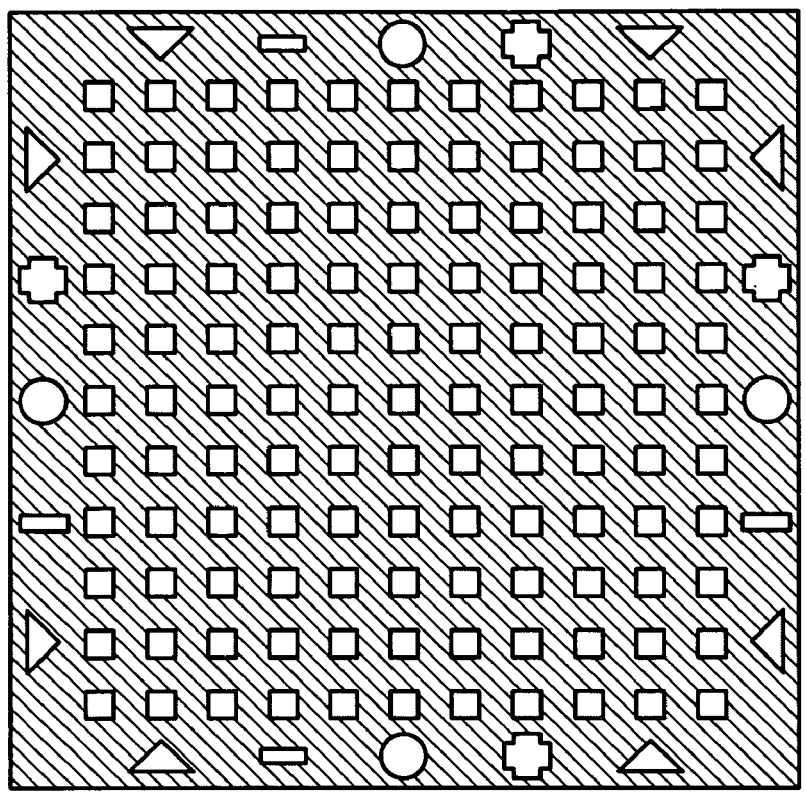
FIG. 4 is a plan view of a reference layer with a dark field.

The reference pattern 50 shown in FIG. 2 is referred to as a light field because the array of shapes 52 are viewed as dark on a light background. FIG. 4 shows a reference pattern 50 with the opposite polarity, also referred to as a dark field.

Figure 5:
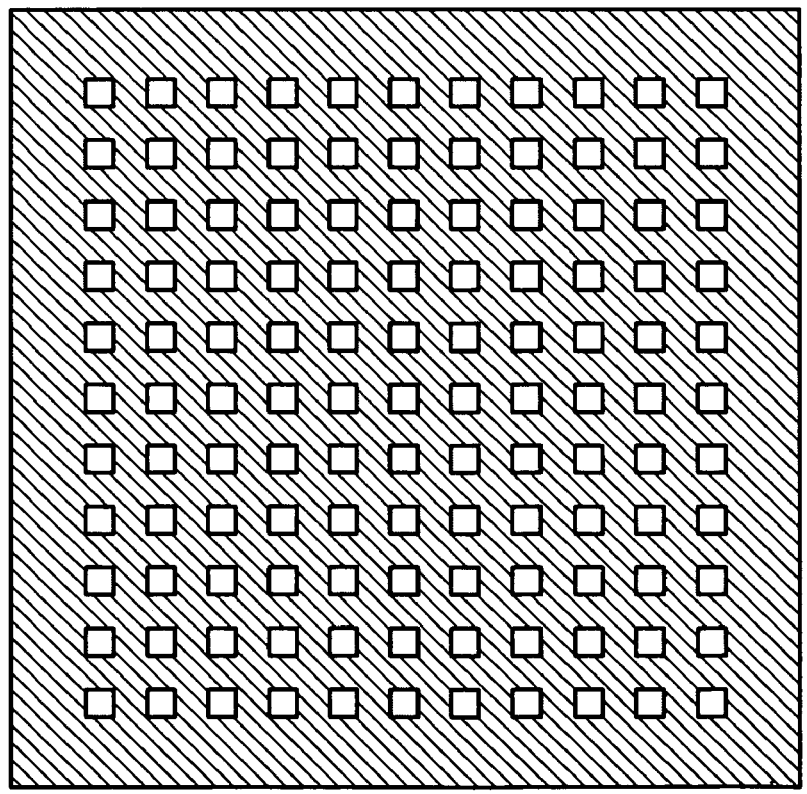
FIG. 5 is a plan view of an active layer with a dark field.

Likewise, FIG. 3 showed an active pattern 64 with a light field. FIG. 5 shows an active pattern 64 with a dark field. Depending upon the materials being used and the method selected to delineate either the reference pattern 50 or the active pattern 64, any combination of light field or dark field arrangements can be used. The reference pattern can be dark field or light field. The active pattern can be dark field or light field, regardless of the polarity of the underlying reference pattern.

Figure 6:
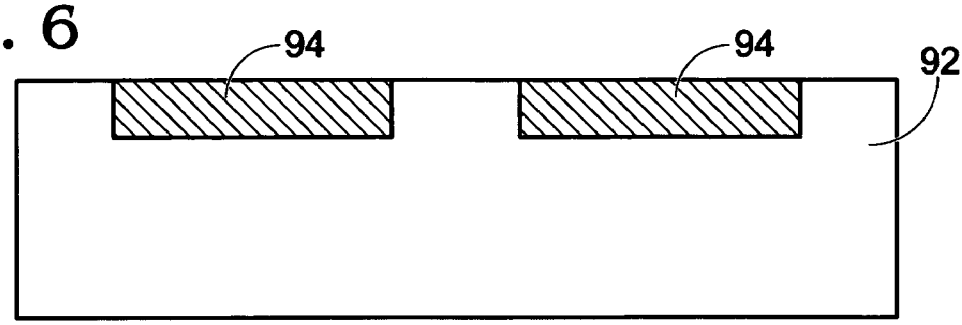
FIG. 6 is a cross-sectional view of a reference layer that is flat.

FIG. 6 shows a cross section of a portion of the reference pattern 50 formed using an underlying substrate 92. The portion of the reference pattern 50 comprises two adjacent shapes 94. The adjacent shapes 94 correspond to individual shapes within the first array of shapes 52. As shown in FIG. 6, the adjacent shapes 94 are level with an upper surface of the substrate. This is a typical arrangement following CMP. For example, in the case of copper metal lines, copper will be inlaid and then poslished.

Figure 7:
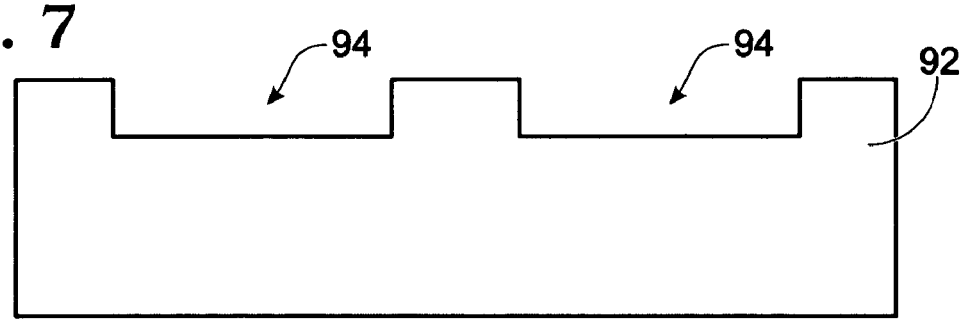
FIG. 7 is a cross-sectional view of a reference layer that is indented.

FIG. 7 shows a cross section of a portion of the reference pattern 50 formed using an underlying substrate 92. The portion of the reference pattern 50 comprises two adjacent shapes 94. The adjacent shapes 94 correspond to individual shapes within the first array of shapes 52. As shown in FIG. 7, the adjacent shapes 94 are etched into the substrate 92. Etching is a common method of patterning a wide variety of materials used in the semiconductor industry.

Figure 8:
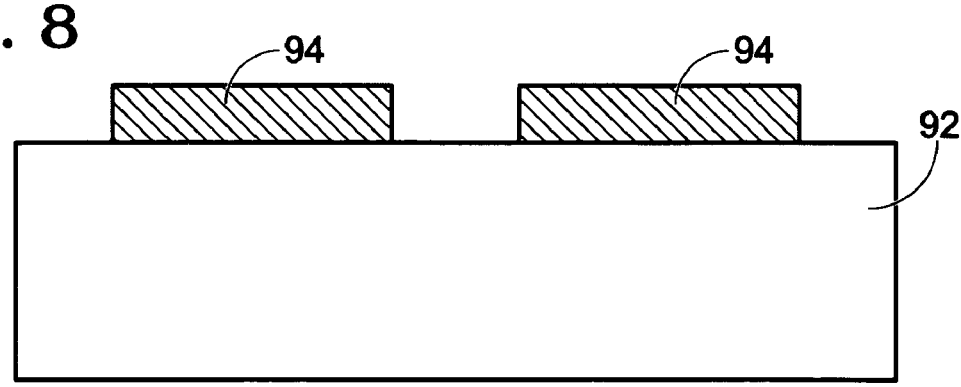
FIG. 8 is a cross-sectional view of a reference layer that is raised.

FIG. 8 shows a cross section of a portion of the reference pattern 50 formed using an underlying substrate 92. The portion of the reference pattern 50 comprises two adjacent shapes 94. The adjacent shapes 94 correspond to individual shapes within the first array of shapes 52. As shown in FIG. 8, the adjacent shapes 94 are formed by depositing a material overlying the substrate 92 and patterning it. Deposition and patterning, by etching, are common methods of producing semiconductor device structures.

Figure 9:
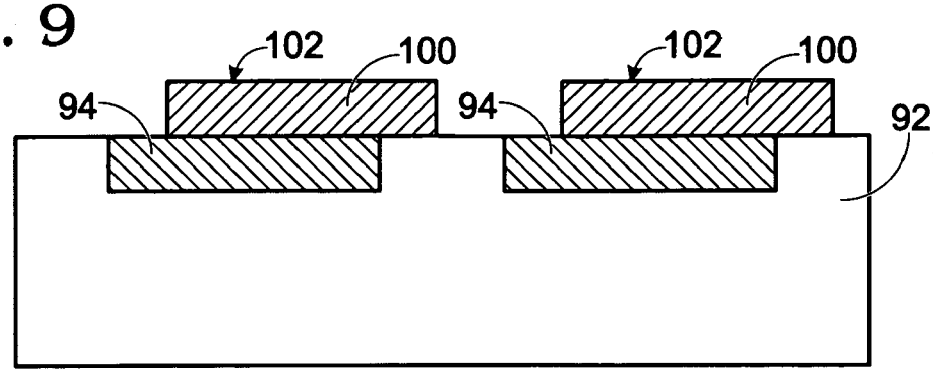
FIG. 9 is a cross-sectional view of an active layer overlying the reference layer of FIG. 6.

FIG. 9 shows a portion of the active pattern 64 overlying the portion of the reference pattern 50 shown in FIG. 6. The portion of the active pattern comprises overlying shapes 100. The overlying shapes 100 correspond to individual shapes within the second array of shapes 66. As shown in FIG. 9, the overlying shapes 100 are formed by depositing photoresist and patterning to form the overlying shapes 100. The overlying shapes 100 have an upper surface 102 that is relatively flat, because the overlying shapes are overlying adjacent shapes 94 that are level with the upper surface of the substrate.

Figure 10:
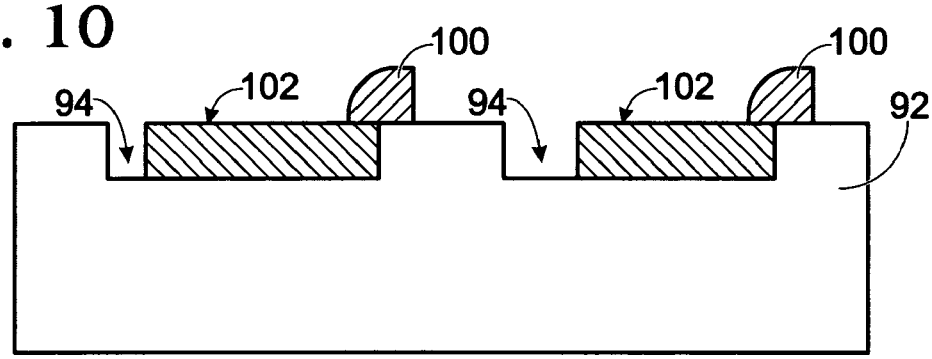
FIG. 10 is a cross-sectional view of an active layer overlying the reference layer of FIG. 7.

FIG. 10 shows the portion of the active pattern 64 overlying the portion of the reference pattern 50 shown in FIG. 7. The portion of the active pattern comprises overlying shapes 100. The overlying shapes 100 correspond to individual shapes within the second array of shapes 66. As shown in FIG. 10, the overlying shapes 100 are formed by depositing photoresist and patterning to form the overlying shapes 100. The upper surface 102 of the overlying shapes 100 are not flat, because the overlying shapes are overlying adjacent shapes 94 that are etched, and the overlying shapes follow the contour of the underlying adjacent shapes 94.

Figure 11:
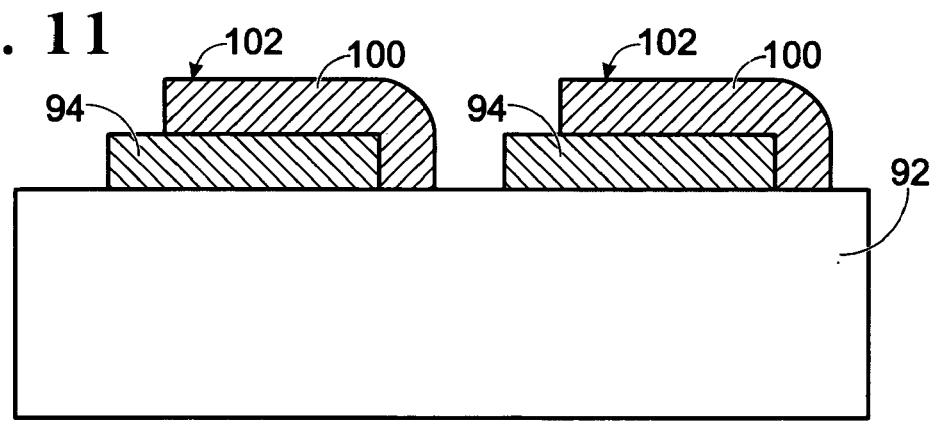
FIG. 11 is a cross-sectional view of an active layer overlying the reference layer of FIG. 8.

FIG. 11 shows the portion of the active pattern 64 overlying the portion of the reference pattern 50 shown in FIG. 8. The portion of the active pattern comprises overlying shapes 100. The overlying shapes 100 correspond to individual shapes within the second array of shapes 66. As shown in FIG. 11, the overlying shapes 100 are formed by depositing photoresist and patterning to form the overlying shapes 100. The upper surface 102 of the overlying shapes 100 are not flat, because the overlying shapes are overlying adjacent shapes 94, are deposited and etched to produce positive relief, and the overlying shapes follow the contour of the underlying adjacent shapes 94.

Figure 12:
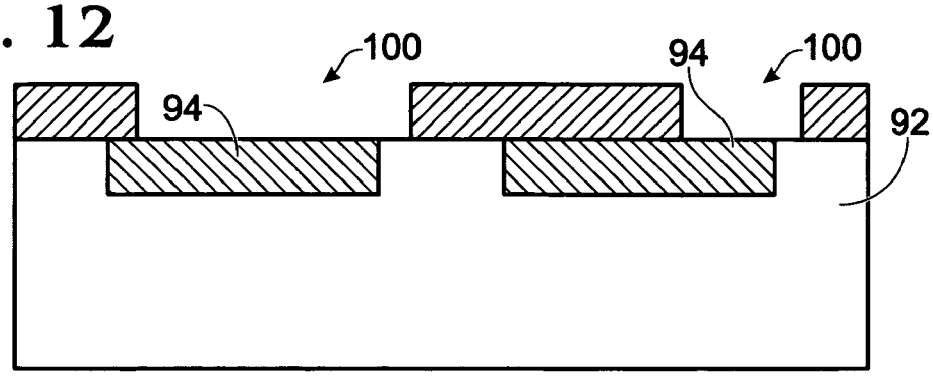
FIG. 12 is a cross-secional view of an active layer with a dark field overlying the reference layer in FIG. 6.

FIG. 12 shows the portion of the active pattern 64 overlying the portion of the reference pattern 50 similar to that shown in FIG. 9 but with a dark field. The portion of the active pattern comprises overlying shapes 100. The overlying shapes 100 correspond to individual shapes within the second array of shapes 66. As shown in FIG. 10, the overlying shapes 100 are formed by depositing photoresist and patterning to form the overlying shapes 100. However, in this case the overlying shapes 100 are formed as trenches by etching into the photoresist, which remains to act as the dark field. Dark field active patterns can also be used with reference patterns shown in FIG. 10 and FIG. 11.

Figure 13:
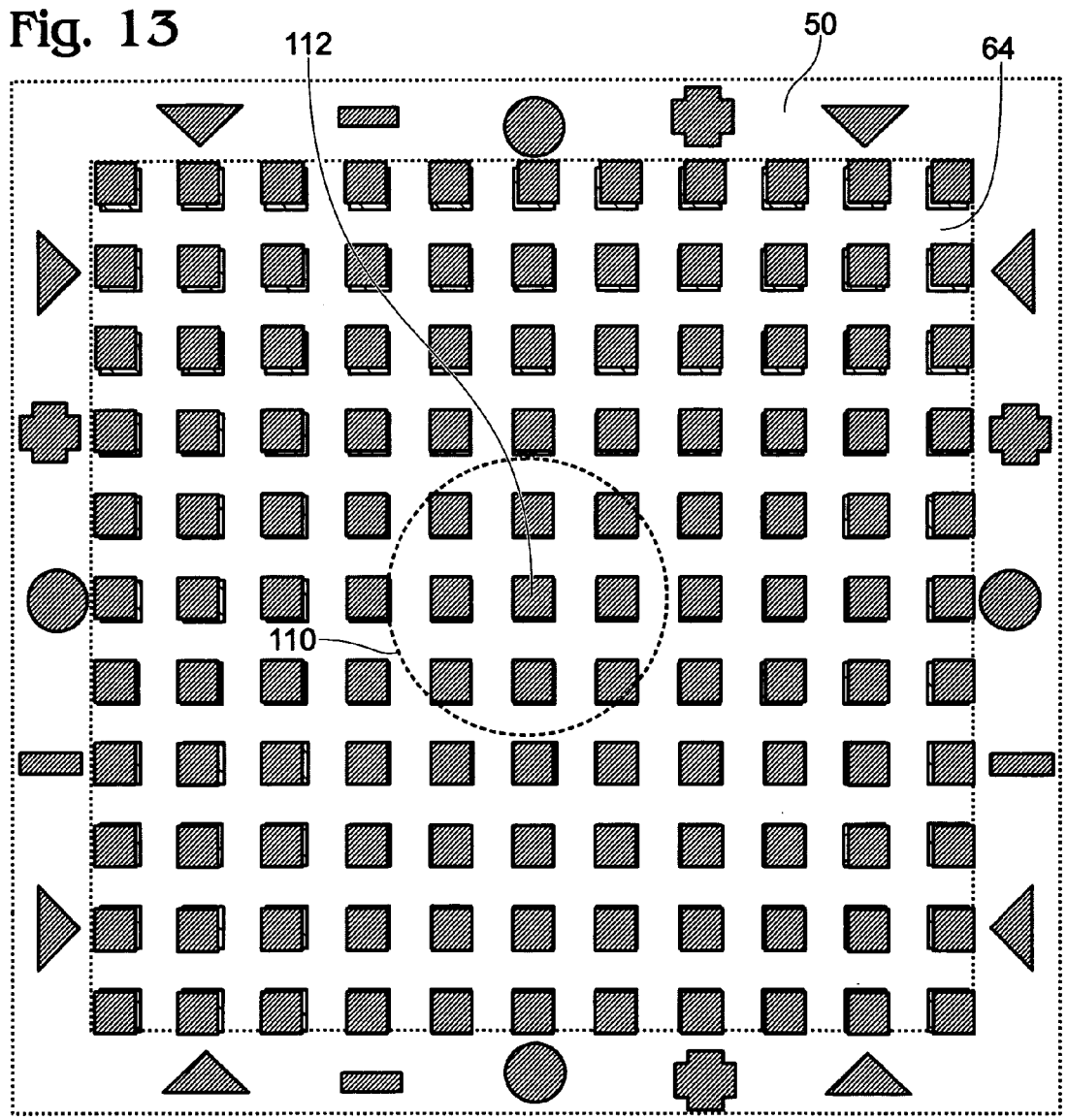
FIG. 13 is a plan view showing an active layer overlying a reference layer in perfect alignment.

FIG. 13 shows a top view of the active pattern 64 overlying the reference pattern 50. Following formation of the reference pattern 50 the active pattern 64 is overlaid on it. An operator can view the complete vernier through a microscope. The operator looks down at the vernier and sees a view similar to that shown in FIG. 13. As shown in FIG. 13 the alignment is essentially perfect. The active pattern 64 is aligned over the reference pattern 50 such that the region of apparent optimum alignment of the first array of shapes and the second array of shapes is in an apparent alignment region 110. More specifically optimum shape alignment is apparent at a pair of overlapped shapes 112. Since overlapped shapes 112 are in line with the centerline marks in both the x-axis and the y-axis the patterns are properly aligned. The operator is able to determine the alignment by looking at a single vernier and determining x and y alignment, without the need to significantly reposition the microscope.

Figure 14:
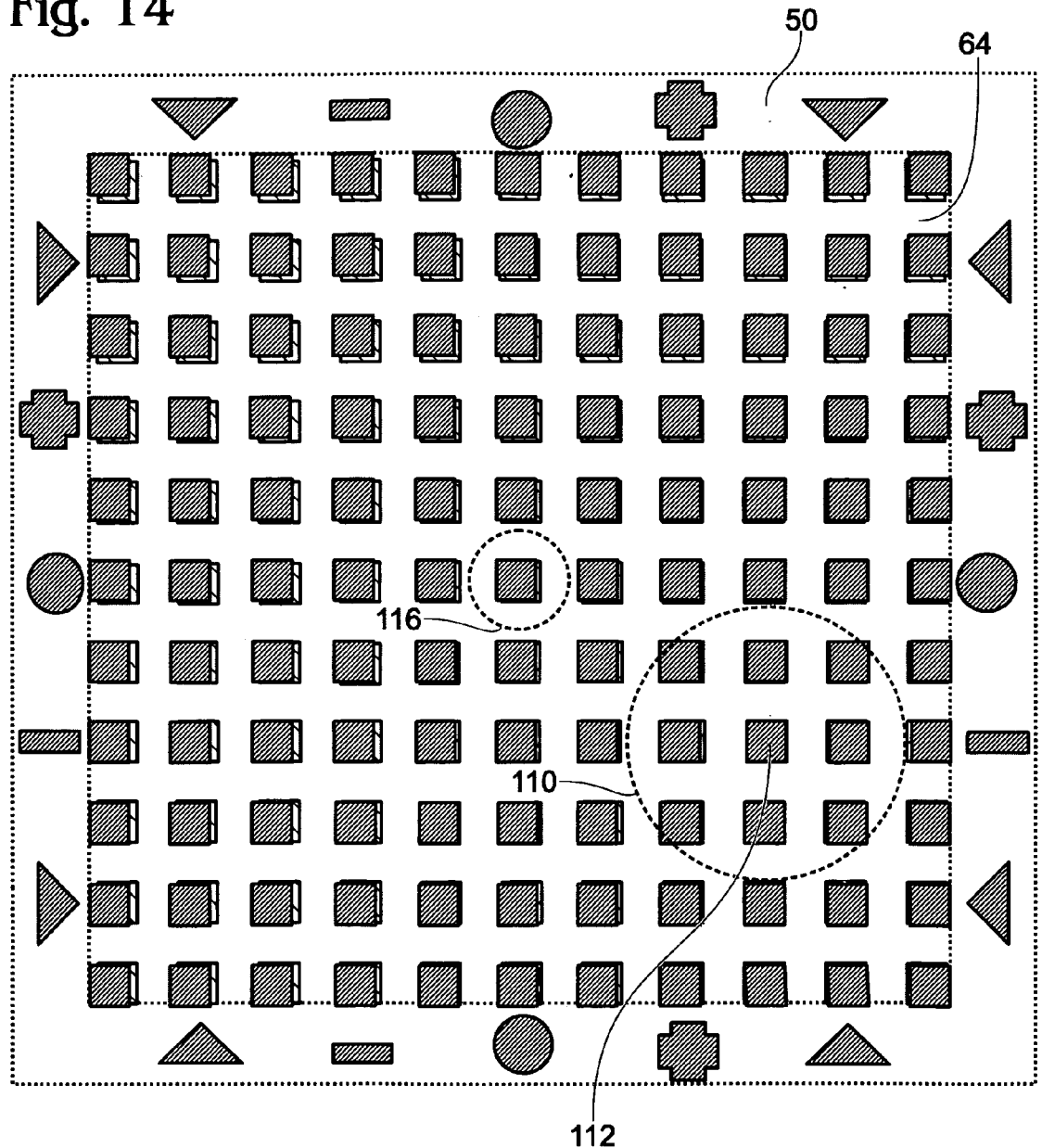
FIG. 14 is a plan view showing an active layer overlying a reference layer in an out of alignment condition.

FIG. 14 shows a top view of the active pattern 64 overlying the reference pattern 50. Again, the operator can view the complete vernier through a microscope. The operator looks down at the vernier and sees a view similar to that shown in FIG. 13, but this time there is a misalignment apparent. As shown in FIG. 14 the alignment is off slightly in both the x-axis and the y-axis. The overlapped shapes 112 in the apparent alignment region 110 that is most aligned is two positions up and three positions over from the optimal centered position 116. Each integer shift in the apparent position corresponds to the absolute difference in the reference pitch and the active pitch as discussed above. So for example, if the difference in pitch were 0.05 micrometers, the operator would determine that the misalignment was +0.15 micrometers in the x-direction and −0.10 micrometers in the y-direction. The operator would then confirm whether this was an acceptable misalignment.

It is thus possible using this two dimensional vernier, for the operator to calculate the level of misalignment in two dimensions simultaneously. Simultaneously as used herein means that no realignment of the microscope to a second vernier is required when taking a reading for two axes of alignment.

What is claimed is:

1. A method of determining misalignment between two patterns formed over a substrate comprising the steps of:
   positioning a two dimensional vernier under a microscope;
   determining an alignment region;
   identifying a pair of overlapped shapes, each shape having a dimension in an "x" direction and a dimension in a "y" direction, that are most fully aligned in both dimensions; and
   ascertaining the position of the pair of overlapped shapes.

2. The method of claim 1, wherein the step of determining the alignment region determines the alignment region in the "x" and "y" directions simultaneously.

3. The method of claim 1, wherein the step of ascertaining the position of the pair of overlapped shapes ascertains the position in the "x" and "y" directions simultaneously.

4. The method of claim 1, further comprising a step of calculating a level of misalignment in both the "x" and "y" directions.

5. The method of claim 4, wherein the step of calculating a level of misalignment comprises determining an integer number of shapes from the centerline for the "x" direction and multiplying it by a resolution for the "x" direction.

6. The method of claim 5, wherein the step of calculating a level of misalignment comprises determining an integer number of shapes from the centerline for the "y" direction and multiplying it by a resolution for the "y" direction.

7. The method of claim 1 wherein the step of identifying the pair of overlapping shapes includes identifying overlapping shapes from:

an underlying array of reference pattern shapes, each reference pattern shape having a first length across each shape, a first distance between adjacent shapes, and a first pitch defined by the first length and the first distance, in orthogonal dimensions; and, an overlying array of active pattern shapes, each active pattern shape having a second length across each shape, a second distance between adjacent shapes, and a second pitch defined by the second length and second distance, different from the first pitch, in orthogonal dimensions.

* * * * *